(12) United States Patent
Yoo

(10) Patent No.: US 10,263,136 B1
(45) Date of Patent: Apr. 16, 2019

(54) DIRECT BAND GAP GROUP IV SEMICONDUCTORS AND METHODS OF PREPARING THE SAME

(71) Applicant: Los Alamos National Security, LLC, Los Alamos, NM (US)

(72) Inventor: Jinkyoung Yoo, Los Alamos, NM (US)

(73) Assignee: Triad National Security, LLC, Los Alamos, NM (US)

( * ) Notice: Subject to any disclaimer, the term of this patent is extended or adjusted under 35 U.S.C. 154(b) by 0 days.

(21) Appl. No.: 15/793,804

(22) Filed: Oct. 25, 2017

Related U.S. Application Data

(60) Provisional application No. 62/412,789, filed on Oct. 25, 2016.

(51) Int. Cl.
*H01L 31/18* (2006.01)
*H01L 21/02* (2006.01)
*H01L 33/34* (2010.01)
*C30B 29/60* (2006.01)

(52) U.S. Cl.
CPC ........ *H01L 31/1816* (2013.01); *C30B 29/602* (2013.01); *H01L 21/0234* (2013.01); *H01L 21/02381* (2013.01); *H01L 21/02433* (2013.01); *H01L 21/02527* (2013.01); *H01L 21/02609* (2013.01); *H01L 33/34* (2013.01)

(58) Field of Classification Search
CPC ............. H01L 31/1816; H01L 21/0234; H01L 21/0238; H01L 21/02381; H01L 21/02433; H01L 21/02527; H01L 21/02609; H01L 33/34; C30B 29/602
See application file for complete search history.

(56) References Cited

U.S. PATENT DOCUMENTS

| 5,815,520 | A | * | 9/1998 | Furushima | ............ H01L 33/007 257/94 |
| 2001/0038655 | A1 | * | 11/2001 | Tanaka | .................... B82Y 20/00 372/43.01 |
| 2003/0006406 | A1 | * | 1/2003 | Chikyow | .......... H01L 21/02381 257/12 |
| 2004/0099918 | A1 | * | 5/2004 | Noguchi | ........... H01L 21/02381 257/416 |
| 2011/0147791 | A1 | * | 6/2011 | Norman | .............. H01L 21/0237 257/103 |

(Continued)

OTHER PUBLICATIONS

Hauge, Håkon Ikaros T., et al., Hexagonal Silicon Realized, Nano Letters, American Chemical Society, 2015, vol. 15, pp. 5855-5860, 6 pages.

(Continued)

*Primary Examiner* — Karen Kusumakar
(74) *Attorney, Agent, or Firm* — Lewis Roca Rothgerber Christie LLP

(57) ABSTRACT

A semiconductor film includes a two-dimensional (2D) material layer having a hexagonal in-plane lattice structure, and a substantially planar Group IV semiconductor layer having a direct band gap on the 2D material layer. A method of fabricating a semiconductor material includes growing a Group IV semiconductor material on a two-dimensional material having a hexagonal in-plane lattice structure. This growth process results in the Group IV semiconductor material having a direct band gap. The semiconductor films may be used in any optoelectronic device, including flexible devices.

20 Claims, 2 Drawing Sheets

(56) References Cited

U.S. PATENT DOCUMENTS

2012/0028052 A1* 2/2012 Chu ............... H01L 21/02378
                                                        428/428
2014/0242807 A1* 8/2014 Bedell ............ H01L 21/02318
                                                        438/759

OTHER PUBLICATIONS

Hauge, Håkon Ikaros T., et al., Single-Crystalline Hexagonal Silicon-Germanium, Nano Letters, American Chemical Society, 2017, vol. 17, pp. 85-90 6 pages.

* cited by examiner

DIRECT BAND GAP GROUP IV SEMICONDUCTORS AND METHODS OF PREPARING THE SAME

CROSS-REFERENCE TO RELATED APPLICATION(S)

This application claims priority to and the benefit of U.S. Provisional Application Ser. No. 62/412,789 filed on Oct. 25, 2016 and titled DIRECT BAND GAP GROUP IV SEMICONDUCTORS AND METHODS OF PREPARING THE SAME, the entire content of which is incorporated herein by reference.

STATEMENT REGARDING FEDERALLY SPONSORED RESEARCH OR DEVELOPMENT

The United States government has certain rights in this invention pursuant to Contract No. DE-AC52-06NA25396 between the United States Department of Energy and Los Alamos National Security, LLC for the operation of Los Alamos National Laboratory.

BACKGROUND

Group IV semiconductors (e.g., Si and Ge) are ideal materials for next-generation optoelectronic applications because they enable monolithic integration for mass production, automated full-freedom design through established design rules, and compatibility with other Group IV materials (e.g., diamond with nitrogen vacancies, carbon nanotubes with solitary dopants) for quantum emitters. Despite several decades-long efforts aimed at developing Si/Ge-based integrated optoelectronic systems, however, these applications have not yet been realized, primarily due to the absence of highly efficient Si- and Ge-based light emitters. The main roadblock to the production of Si/Ge-based light emitters is the indirect band gap of Group IV semiconductor materials, which results in high non-radiative recombination. Several efforts have focused on addressing this issue, including strain engineering, nano-structuring, and alloying. Nevertheless, a reliable, controllable, and production-compatible process for preparing direct band gap Si and Ge has yet to be achieved.

SUMMARY

According to embodiments of the present disclosure, a semiconductor film includes a two-dimensional material layer having a hexagonal in-plane lattice structure, and a Group IV semiconductor layer on the two-dimensional material layer. The Group IV semiconductor layer has a direct band gap by virtue of a structure transfer mechanism that transfers the hexagonal structure of the two-dimensional material layer to the Group IV semiconductor layer. In some embodiments, the Group IV semiconductor layer may include an elemental Group IV semiconductor material, or a compound Group IV semiconductor material. For example, in some embodiments, the Group IV semiconductor layer may include Si and/or Ge.

In some embodiments, the Group IV semiconductor layer is a single crystalline film. For example, in some embodiments, the Group IV semiconductor layer is substantially free of structural defects. In some embodiments, for example, the Group IV semiconductor layer is a planar thin film.

The two-dimensional material layer is two-dimensional, i.e., substantially planar, in geometry or structure in order to enable growth of a similarly two-dimensional or substantially planar Group IV semiconductor layer or thin film. Additionally, the two-dimensional material layer may include an insulating material, a semiconducting material, a metallic material, and/or a superconducting material. For example, in some embodiments, the two-dimensional material layer may include graphene, hexagonal boron nitride (h-BN), a transition metal dichalcogenide (TMDC), or a combination thereof. In some embodiments, for example, the two-dimensional material layer may include graphene, h-BN, $NbSe_2$, $MoS_2$, or a combination thereof.

In some embodiments, a method of fabricating a semiconductor material includes growing a Group IV semiconductor material on a two-dimensional (e.g., substantially planar) material that has a hexagonal in-plane lattice structure. When grown according to these methods, the Group IV semiconductor material has a direct band gap after growth. Also, the Group IV semiconductor material can be grown as a substantially planar thin film.

The method may further include growing the two-dimensional material on a handle substrate prior to growing the Group IV semiconductor material. The Group IV semiconductor material may be grown via an epitaxial growth technique.

In some embodiments, an optoelectronic device includes a semiconductor film grown according to methods according to embodiments of the present invention. The optoelectronic device may be a flexible device.

BRIEF DESCRIPTION OF THE DRAWING

These and other features and advantages of embodiments of the present invention will be better understood when considered in conjunction with the accompanying drawings, in which.

DETAILED DESCRIPTION

Figure 1:
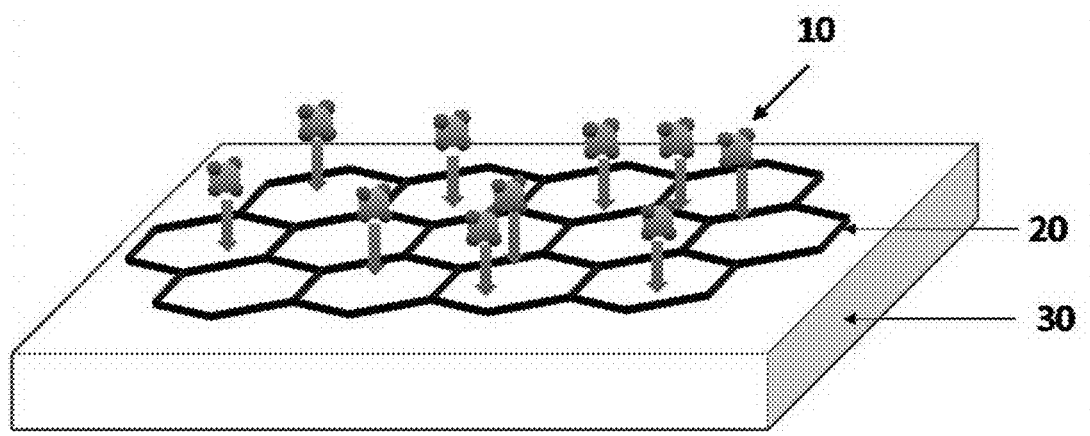
FIG. 1 is a schematic showing the interaction of Group IV precursor molecules with the hexagonal in-plane lattice structure of the underlying 2D material, and schematically depicting the structural transfer of the hexagonal in-plane lattice from the 2D material layer to the grown Group IV layer through a van der Waals interface, according to embodiments of the present invention.

According to embodiments of the present invention, an approach for creating direct band gaps in planar or substantially planar Group IV materials (or Group IV material layers) includes van der Waals epitaxy. Indeed, according to embodiments of the present invention, direct band gaps in Group IV materials are achieved through the growth of hexagonal phase Group IV semiconductor materials, using a combination of two-dimensional (2D) materials (e.g., hexagonal boron nitride (h-BN), graphene, transition metal chalcogenides, etc.) and semiconductor processing techniques (e.g., chemical vapor deposition). As used herein, the terms "direct band gap Group IV materials," "w-Si/Ge" and like terms are used interchangeably to refer to any Group IV material that has a direct band gap as opposed to an indirect band gap. In particular, while portions of this disclosure may refer to "w-Si/Ge," it is understood that this term refers to any Group IV semiconductor material, and not only to Si and/or Ge. Additionally, the terms "Group IV materials," "w-Si/Ge" and like terms refer to elemental semiconductors (e.g., Si or Ge) as well as compound semiconductors including two or more Group IV elements.

As is known to those of ordinary skill in the art, Group IV elemental and compound semiconductors typically have indirect band gaps. While semiconductors with direct band gaps are infinitely more preferred, no known method of preparing Group IV semiconductors with direct band gaps has proven reproducible, reliable and capable of large-scale production. According to embodiments of the present invention, a method of preparing Group IV elemental or compound semiconductors in a planar or substantially planar film or thin film geometry with direct band gaps is both reliable and reproducible, and also suitable for large-scale or mass production.

Additionally, in embodiments of the present invention, the method of preparing direct band gap Group IV elemental or compound semiconductors yields a semiconductor film (e.g., a planar or substantially planar film or thin film) that is substantially free of structural defects. In some embodiments, for example, the semiconductor film may be completely free of structural defects. As used, herein, the term "structural defects" is used in its art-recognized sense to refer to defects in the films prepared by the selected growth method, which can include, for example, strain, stacking faults, and threading dislocations. Also, as used herein, the term "substantially" is used as a term of approximation, and not as a term of degree, and is intended to account for the inherent deviation and variation in the measurements, observations and/or calculations used to determine the relevant characteristic. For example, a film or Group IV direct band gap material that is substantially free of structural defects has only a negligible number of defects such that any defects that are present do not affect the performance of the film or material in its intended application. In contrast, a film or material that is completely free of defects has no measurable or observable defects. As another example, a film or layer that is substantially planar appears planar or two-dimensional by observation (e.g., by the naked eye or under certain microscopes or conditions), but may not be perfectly planar when observed under extreme magnification or other more scrupulous conditions. In any case, a film or layer that is substantially planar is one that is considered two-dimensional or planar by those of ordinary skill in the art.

According to embodiments of the present invention, a semiconductor film includes a direct band gap Group IV material (i.e., either elemental or compound material) layer on a layered structure, or 2D material layer which has a hexagonal in-plane lattice structure. The direct band gap Group IV material (i.e., either elemental or compound material) may be prepared by growth of the desired material on the 2D material having the hexagonal in-plane lattice structure. The 2D substrate material is two-dimensional in overall structure, as its name suggests, and is planar or substantially planar in surface geometry. While the 2D substrate material is described throughout this disclosure as being two-dimensional in overall structure, it is understood that the 2D substrate material or layer does have thickness dimension. As such, the 2D substrate material may indeed have measurable parameters in three dimensions. However, as used herein, the term "two-dimensional in overall structure" refers to the planar or substantially planar nature of the layer or film of the 2D substrate material, as would be understood by those of ordinary skill in the art. By way of comparison, the 2D substrate material may be envisioned similar to a sheet of paper, which technically has length, width and thickness dimensions, but is generally considered two-dimensional. Similarly, the 2D substrate material according to embodiments of the present invention may also have length, width and thickness dimensions, but like the sheet of paper, the 2D substrate material would be generally considered two-dimensional by virtue of the relative sizes of the length, width and thickness dimensions.

The two-dimensional nature and planar or substantially planar surface geometry of the 2D substrate material enables growth of a planar or substantially planar film of the Group IV material. In some embodiments, for example, the Group IV material is grown as a planar or substantially planar film or thin film on the 2D substrate material. As would be understood by those of ordinary skill in the art, similar to the 2D substrate material, the substantially planar film or thin film of the Group IV material may technically be three-dimensional in that it has length, width and thickness dimensions, but remains planar or substantially planar in surface geometry, as discussed above in connection with the 2D substrate material. For example, as discussed above, the Group IV material according to embodiments of the present invention may also have length, width and thickness dimensions, but like the sheet of paper and the 2D substrate material, the Group IV material would be generally considered two-dimensional, planar or substantially planar by virtue of the relative sizes of the length, width and thickness dimensions.

The 2D substrate material is not particularly limited, and may be any 2D material known for use in semiconductor epitaxial growth techniques that has a hexagonal in-plane lattice structure. Indeed, the 2D material may be insulating, semiconducting, metallic, and/or superconducting. Some non-limiting examples of suitable 2D materials include graphene, hexagonal boron nitride (h-BN), and transition metal dichalcogenides (TMDCs). In some embodiments, for example, the 2D materials may include graphene, h-BN, $NbSe_2$, $MoS_2$, and the like, and combinations thereof. For example, in some embodiments, the 2D may include a combination of two or more different materials. In some embodiments, for example, the 2D layer includes a combination of graphene and $MoS_2$, a combination of graphene and h-BN, or a combination of graphene and $NbSe_2$. In some embodiments, the 2D layer includes a combination of graphene and h-BN. Indeed, in some embodiments, the 2D layer may include a heterostructure of 2D materials, some nonlimiting examples of which include graphene/h-BN heterostructures, graphene/TMDC(s) heterostructures, h-BN/TMDC(s) heterostructures, etc.

The thickness of the 2D layer is not particularly limited, and may be any suitable thickness for effecting growth of the direct band gap Group IV material layer. Indeed, the 2D material layer may have thicknesses on the order of several microns. In some embodiments, however, the thickness of the 2D material layer may be smaller, e.g., on the order of a thin film thickness. As used herein, the term "thin film" is used in its art-recognized sense to refer to a film that is deposited or printed to a thin or very thin thickness, e.g. from a fraction of a nanometer to several microns. For example, the 2D layer may be an atomically thin layer, for example, having a thickness of 100 nm or less. In some embodiments, for example, the 2D layer may have a thickness of about 10 nm to about 50 nm, for example about 20 nm to about 40 nm.

The growth technique for growing the direct band gap Group IV material layer is also not particularly limited, and may include any suitable growth technique. In some embodiments for example, the growth technique may include exfoliation or epitaxial growth. The exfoliation technique is known to those of ordinary skill in the art, and may include any suitable mode of exfoliation, e.g., mechanical exfoliation (including but not limited to the use of an adhesive tape) from a bulk block of the desired material. After such exfoliation, the 2D materials may be transferred to an appropriate handle substrate (e.g., Si, $SiO_2$, wafers, glass, flexible polymer substrates, etc.).

In some embodiments, the growth technique may include any epitaxial growth technique, nonlimiting examples of which include chemical vapor deposition, plasma vapor deposition, atomic layer deposition, molecular beam epitaxy, sputtering, etc. These growth techniques are known to those of ordinary skill in the art, and the ordinary artisan is capable of selecting an appropriate growth technique based on the desired Group IV material to be deposited. Additionally, the ordinary artisan is capable of selecting appropriate growth parameters and source materials based on the desired chemistry and thickness of the deposited material or layer.

The 2D layer may also be deposited or grown by any suitable technique. For example, in some embodiments, the 2D layer may be grown by any suitable epitaxial growth technique, nonlimiting examples of which include chemical vapor deposition, plasma vapor deposition, atomic layer deposition, molecular beam epitaxy, sputtering, etc. As noted above, these growth techniques are known to those of ordinary skill in the art, and the ordinary artisan is capable of selecting an appropriate growth technique based on the desired 2D material to be deposited. Additionally, the ordinary artisan is capable of selecting appropriate growth parameters and source materials based on the desired chemistry and thickness of the deposited material or layer.

Additionally, as would be readily understood by those of ordinary skill in the art, and according to embodiments of the present invention, the deposition of the 2D material may be accomplished by the use of an appropriate precursor which, when reacted according to the selected growth technique, forms the 2D material on the target substrate (i.e., a handle substrate). Precursors suitable for depositing a layer of 2D materials are known in the art, and those of ordinary skill in the art are capable of selecting an appropriate precursor material to effect deposition of the desired 2D material layer.

The direct band gap Group IV material that is grown on the 2D material may be any elemental or compound Group IV semiconductor material. For example, in some embodiments, the direct band gap Group IV material may include Si, Ge, C and/or Sn. In some embodiments, for example, the direct band gap Group IV material may include Si and/or Ge (also denoted herein as "Si/Ge"). For example, in some embodiments, the direct band gap Group IV material may include elemental Si or elemental Ge having a direct band gap.

In some embodiments, for example, the direct band gap Group IV material may include a compound material including two or more Group IV elements as a compound or alloy. For example, in some embodiments, the compound direct band gap Group IV material may include a compound of Si or Ge with one or more of Si, Ge, C and/or Sn. In some embodiments, for example, the compound direct band gap Group IV material may include SiGe, SiSn, or GeSn. For example, in some embodiments, the compound direct band gap Group IV material may include SiGe. Also, in some embodiments, the compound direct band gap Group IV material may include a multi-stack of Group IV materials, or a Group IV material heterostructure, some nonlimiting examples of which include Si/Ge, SiGe/Si/Ge, etc. The proportion of each of the elements in the compound direct band gap Group IV material is not particularly limited, and the compound direct band gap Group IV material may include any suitable atomic or molar amount of each of its constituent elements. Additionally, as would be readily understood by those of ordinary skill in the art, and according to embodiments of the present invention, the deposition of the direct band gap Group IV material may be accomplished by the use of an appropriate precursor which, when reacted according to the selected growth technique, forms the Group IV material on the target substrate (i.e., the 2D material layer). Precursors suitable for depositing a layer of Group IV materials, whether elemental or compound, are known in the art, and those of ordinary skill in the art are capable of selecting an appropriate precursor material to effect deposition of the desired semiconductor layer. Nonlimiting examples of precursors useful for depositing an elemental Si layer include silane, Si tetrachloride, etc., and nonlimiting examples of precursors useful for depositing an elemental Ge layer include germane, digermane, Ge tetrachloride, etc.

The thickness of the direct band gap Group IV layer is not particularly limited, and may be any suitable thickness. Indeed, the desired thickness of the direct band gap Group IV layer may vary depending on the intended application of the layer. In some embodiments, the direct band gap Group IV layer may have a thickness on the order of microns, e.g., one micron or greater, or about 1 micron. In some embodiments, however, depending on the desired application for the layer, the direct band gap Group IV layer may have a thickness on the order of a thin film thickness. In some embodiments, for example, the direct band gap Group IV layer may have a thickness of 100 nm or less. In some embodiments, for example, the direct band gap Group IV layer may have a thickness of about 10 nm to about 50 nm, for example about 20 nm to about 40 nm.

Additionally, the direct band gap Group IV material layer that is grown on the 2D material layer is single crystalline in quality, i.e., the deposited direct band gap Group IV layer is a single crystalline film, for example, a single crystalline thin film. As used herein, the terms "single crystalline," "single crystalline film," and like terms are used in their art-recognized senses to refer to materials, layers and films in which the crystal lattice of the entire material sample, layer or film is continuous and unbroken. Indeed, as would be readily appreciated by those of ordinary skill in the art, the terms "single crystalline," "single crystalline film," and like terms refer to the substantial or complete lack of structural defects in the grown material, layer or film. The single crystalline quality of the direct band gap Group IV layers makes them particularly desirable for many optoelectronic applications.

According to embodiments of the present invention, the 2D layer and direct band gap Group IV layer may be grown on (or otherwise attached to) a handle substrate. The handle substrate is not particularly limited and can be suitable handle substrate that is capable of mechanically supporting the 2D layer and direct band gap Group IV layer. As would be understood by those of ordinary skill the art, the handle substrate should be compatible with the device and/or reactor used in the selected growth technique. A nonlimiting example of a suitable handle substrate is a $SiO_2$/Si wafer (i.e., a Si wafer coated with a layer of $SiO_2$). Handle substrates suitable for different growth reactors and/or devices are well known in the relevant field, and the selection of an appropriate such handle substrate is within the knowledge and skill of those of ordinary skill in this field.

Additionally, as is known to those of ordinary skill in the art, the handle substrate may be removed (e.g., etched away, etc.) prior to use of the direct band gap Group IV layer/2D layer structure in its desired or intended application, or prior to incorporation of the direct band gap Group IV layer/2D layer structure in its desired or intended device (e.g., an optoelectronic circuit or device).

Without being bound by any particular theory, it is believed that the methods according to embodiments of the present invention result in the bonding of the 3D material (i.e., the direct band gap Group IV material which may have surface dangling bonds) to the 2D layer (which does not have surface dangling bonds) through van der Waals (vDW) interactions. This interaction is shown schematically in FIGS. 1 and 2. FIG. 1 depicts the interaction of Group IV precursor materials 10 (depicted as spherical central Group IV atoms (e.g., Si or Ge) with four substituents (e.g., H or a halide such as Cl), yielding, e.g., silane, germane, Si tetrachloride, di germane, Ge tetrachloride, etc. selected for use based on the growth technique) with the hexagonal crystal structure of the 2D layer 20. FIG. 1 also shows the deposition of the 2D layer 20 on a handle substrate 30.

Figure 2:
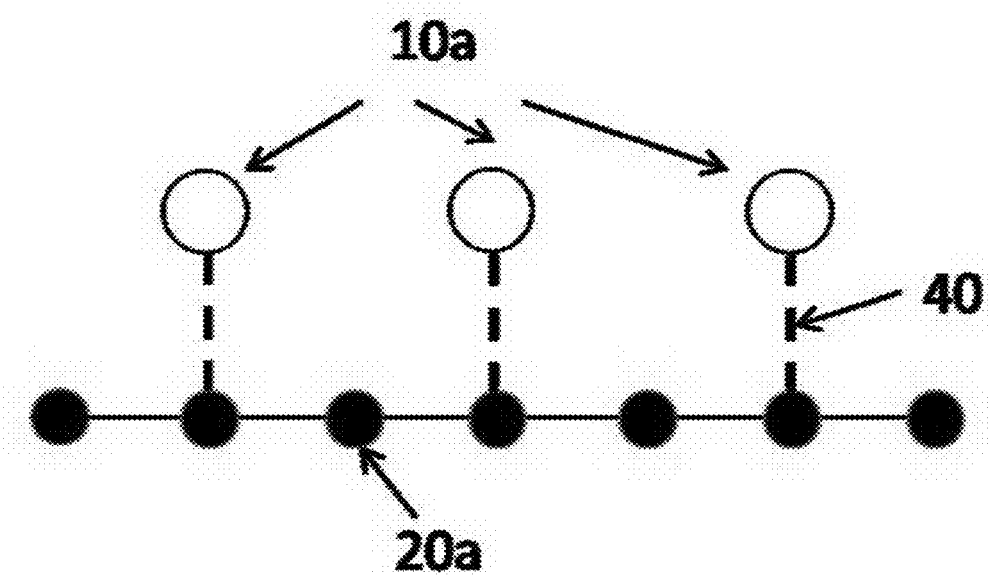
FIG. 2 is a simplified schematic depicting the interaction of Group IV elemental atoms with the hexagonal in-plane lattice structure of the underlying 2D material, according to embodiments of the invention.

In a simplified schematic, FIG. 2 depicts the interaction of Group IV elemental atoms 10a with the hexagonal in-plane lattice structure 20a of the 2D layer, showing the van der Waals interaction or "bonds" 40 between the Group IV atoms 10a and the 2D layer 20a. As shown in FIG. 2, the Group IV atoms 10a formed on the 2D material 20a copy the structure of the 2D material 20a, i.e., the hexagonal structure of the 2D material 20a is transferred to the Group IV layer 10a over the van der Waals gap 40.

In FIG. 1, the Group IV materials 10 are shown as precursor materials (e.g., hydrides or halides (e.g., chlorides) of the Group IV element). While FIG. 1 shows the interaction of these precursor molecules, which are used in certain deposition techniques (e.g., chemical vapor deposition), it is understood that the depicted Group IV materials may also be elemental atoms of Group IV materials 10, e.g., when the deposition technique is a physical deposition technique (e.g., e-beam evaporation, pulsed laser deposition, sputtering, etc.). Additionally, in either chemical or physical deposition technique (or indeed in any growth technique), the Group IV materials 10 depicted in FIG. 1 may also include dopant precursors (e.g., diborane, phosphine, etc.) or dopant atoms.

Additionally, as noted above, the direct band gap Group IV materials grown according to embodiments of the present invention are substantially (and in some embodiments, completely) free of structural defects. Again, without being bound by any particular theory, it is believed that the lack (or substantial lack) of surface defects is due to the absence of covalent bonding at the interface. This van der Waals interaction coupled with the hexagonal crystal structure of the 2D layer enable crystal structure transfer from the 2D layer to the grown Group IV layer, resulting in a conversion of the cubic crystal structure typically found in Group IV materials to a hexagonal crystal structure. This crystal structure transfer mechanism enables growth of the 3D material in a 2D film or thin film on the 2D substrate material. Additionally, while Group IV materials ordinarily only have indirect band gaps, this crystal structure transfer results in the preparation of Group IV semiconductor materials and layers having direct band gaps, making them particularly desirable for use in a litany of optoelectronic applications. In contrast to other methods attempting to grow hexagonal Group IV materials or Group IV materials having a direct band gap, the methods according to the present invention do not create core/shell crystals or grains of the Group IV material, and instead result in 2D, planar or substantially planar films or thin films of the Group IV material having the direct band gap. Additionally, unlike other methods attempting to grow hexagonal Group IV materials or Group IV materials having a direct band gap, the methods according to embodiments of the present invention can tune or alter the characteristics of the grown Group IV layer via any suitable technique, such as doping or alloying.

The structure transfer mechanism of preparing the direct band gap Group IV materials also allows for easy tuning of the resulting semiconductor layer. For example, the resulting direct band gap Group IV material may be easily doped during the process to adjust the chemical, optical or electrical properties of the resulting semiconductor layer. The dopant is not particularly limited, and may be any suitable dopant, which dopants are known to those of ordinary skill in the art. The procedures for doping the semiconductor layer are also known to those of ordinary skill in the art. While the dopant and the procedure for doping may vary based on the growth technique selected or the desired properties of the semiconductor layer, those of ordinary skill in art are capable of selecting a suitable dopant and doping procedure based on the growth technique used, the desired properties of the layer and the intended application of the material.

According to embodiments of the present invention, the process for preparing direct band gap Group IV semiconductors is versatile and tunable. Indeed, as discussed herein, the process according embodiments of the present invention forms heterostructures including Group IV semiconductor materials (e.g., Si/Ge) on 2D materials that range from insulating (e.g., h-BN) to semiconducting (e.g., $MoS_2$) to metallic (e.g., graphene) to superconducting (e.g., $NbSe_2$). Additionally, the growth processes according to embodiments of the present invention can lead to enhanced charge carrier mobility in semiconducting 2D materials, superconducting proximity effects (in, e.g., Al/w-Ge/$NbSe_2$), and Langevin recombination in thin p-n junctions (e.g., w-Ge—Si/TMDCs). These properties make the direct band gap Group IV semiconductor materials and layers desirable for use in various optoelectronic devices, e.g., the materials may be used to fabricate monolithic optoelectronic circuits incorporating light emitters, waveguides, and detectors. Additionally, because the semiconductor films according to embodiments of the present invention can be grown as single crystalline thin films, they can be used in flexible devices. The structure and fabrication methods of such optoelectronic devices are known to those of ordinary skill in the art, and such ordinary artisans would be readily capable of incorporating the direct band gap Group IV materials according to embodiments of the present invention in any known optoelectronic circuit or device.

While certain exemplary embodiments of the present disclosure have been illustrated and described, those of ordinary skill in the art will recognize that various changes and modifications can be made to the described embodiments without departing from the spirit and scope of the present invention, and equivalents thereof, as defined in the claims that follow this description. For example, although certain components may have been described in the singular, i.e., "a" 2D material, "a" Group IV material, and the like, one or more of these components in any combination can be used according to the present disclosure.

Also, although certain embodiments have been described as "comprising" or "including" the specified components, embodiments "consisting essentially of" or "consisting of"

the listed components are also within the scope of this disclosure. For example, while embodiments of the present invention are described as comprising a direct band gap Group IV material and a 2D material layer, embodiments consisting essentially of or consisting of these actions are also within the scope of this disclosure. Accordingly, a semiconductor film may consist essentially of a 2D material layer and a direct band gap Group IV material layer. In this context, "consisting essentially of" means that any additional components will not materially affect the chemical, physical, optical or electrical properties of the semiconductor film.

As used herein, unless otherwise expressly specified, all numbers such as those expressing values, ranges, amounts or percentages may be read as if prefaced by the word "about," even if the term does not expressly appear. Further, the word "about" is used as a term of approximation, and not as a term of degree, and reflects the penumbra of variation associated with measurement, significant figures, and interchangeability, all as understood by a person having ordinary skill in the art to which this disclosure pertains. Any numerical range recited herein is intended to include all sub-ranges subsumed therein. Plural encompasses singular and vice versa. For example, while the present disclosure may describe "a" 2D material or "a" Group IV material, a mixture of such materials can be used. When ranges are given, any endpoints of those ranges and/or numbers within those ranges can be combined within the scope of the present disclosure. The terms "including" and like terms mean "including but not limited to," unless specified to the contrary.

Notwithstanding that the numerical ranges and parameters set forth herein may be approximations, numerical values set forth in the Examples are reported as precisely as is practical. Any numerical value, however, inherently contains certain errors necessarily resulting from the standard variation found in their respective testing measurements. The word "comprising" and variations thereof as used in this description and in the claims do not limit the disclosure to exclude any variants or additions.

What is claimed is:

1. A semiconductor film, comprising:
   a two-dimensional material layer having a hexagonal in-plane lattice structure, the two-dimensional material layer comprising graphene, hexagonal boron nitride (h-BN), a transition metal dichalcogenide (TMDC), or a combination thereof; and
   a substantially planar Group IV semiconductor layer on the two-dimensional material layer, the Group IV semiconductor layer having a direct band gap.

2. The semiconductor film of claim 1, wherein the Group IV semiconductor layer comprises an elemental Group IV semiconductor material.

3. The semiconductor film of claim 1, wherein the Group IV semiconductor layer is a single crystalline film.

4. The semiconductor film of claim 1, wherein the Group IV semiconductor layer is substantially free of structural defects.

5. The semiconductor film of claim 1, wherein the Group IV semiconductor layer comprises Si and/or Ge.

6. The semiconductor film of claim 1, wherein the Group IV semiconductor layer is a thin film.

7. The semiconductor film of claim 1, wherein the two-dimensional material layer comprises graphene, h-BN, $NbSe_2$, $MoS_2$, or a combination thereof.

8. An optoelectronic device, comprising the semiconductor film of claim 1.

9. The optoelectronic device according to claim 8, wherein the optoelectronic device is a flexible device.

10. A method of fabricating a semiconductor material, the method comprising:
    growing a Group IV semiconductor material on a two-dimensional material, the two-dimensional material having a hexagonal in-plane lattice structure and comprising graphene, hexagonal boron nitride (h-BN), a transition metal dichalcogenide (TMDC), or a combination therof,
    wherein the Group IV semiconductor material has a direct band gap after growth.

11. The method according to claim 10, further comprising growing the two-dimensional material on a handle substrate prior to the growing of the Group IV semiconductor material.

12. The method according to claim 10, wherein the growing the Group IV semiconductor material comprises an epitaxial growth technique.

13. The semiconductor film, comprising:
    a two-dimensional material layer having a hexagonal in-plane lattice structure; and
    a substantially planar Group IV semiconductor layer on the two-dimensional material layer, the Group IV semiconductor layer having a direct band gap and comprising a compound Group IV semiconductor material.

14. The semiconductor film of claim 13, wherein the Group IV semiconductor layer is a single crystalline film.

15. The semiconductor film of claim 13, wherein the Group IV semiconductor layer is substantially free of structural defects.

16. The semiconductor film of claim 13, wherein the Group IV semiconductor layer comprises Si and/or Ge.

17. The semiconductor film of claim 13, wherein the Group IV semiconductor layer is a thin film.

18. The semiconductor film of claim 13, wherein the two-dimensional material layer comprises an insulating material, a semiconducting material, a metallic material, and/or a superconducting material.

19. The semiconductor film of claim 13, wherein the two-dimensional material layer comprises graphene, hexagonal boron nitride (h-BN), a transition metal dichalcogenide (TMDC), or a combination thereof.

20. The semiconductor film of claim 13, wherein the two-dimensional material layer comprises graphene, h-BN, $NbSe_2$, $MoS_2$, or a combination thereof.

* * * * *

UNITED STATES PATENT AND TRADEMARK OFFICE
CERTIFICATE OF CORRECTION

PATENT NO. : 10,263,136 B1
APPLICATION NO. : 15/793804
DATED : April 16, 2019
INVENTOR(S) : Jinkyoung Yoo Page 1 of 1

It is certified that error appears in the above-identified patent and that said Letters Patent is hereby corrected as shown below:

In the Claims

In Column 10, Line 18, Claim 10        delete "therof," and insert -- thereof, --

In Column 10, Line 28, Claim 13        delete "The" and insert -- A --

Signed and Sealed this
Third Day of November, 2020

Andrei Iancu
*Director of the United States Patent and Trademark Office*